(12) United States Patent
Jia et al.

(10) Patent No.: US 10,119,650 B2
(45) Date of Patent: Nov. 6, 2018

(54) FITTING STRUCTURE AND DISPLAY DEVICE

(71) Applicants: BOE TECHNOLOGY GROUP CO., LTD., Beijing (CN); BEIJING BOE MULTIMEDIA TECHNOLOGY CO., LTD., Beijing (CN)

(72) Inventors: Xinhua Jia, Beijing (CN); Hui Jun Li, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

(*) Notice: Subject to any disclaimer, the term of this patent is extended or adjusted under 35 U.S.C. 154(b) by 5 days.

(21) Appl. No.: 14/905,891

(22) PCT Filed: Jun. 15, 2015

(86) PCT No.: PCT/CN2015/081419
§ 371 (c)(1),
(2) Date: Jan. 18, 2016

(87) PCT Pub. No.: WO2016/115814
PCT Pub. Date: Jul. 28, 2016

(65) Prior Publication Data
US 2016/0369937 A1 Dec. 22, 2016

(30) Foreign Application Priority Data
Jan. 19, 2015 (CN) .................... 2015 2 0035871 U

(51) Int. Cl.
*H05K 5/00* (2006.01)
*G06F 1/16* (2006.01)
(Continued)

(52) U.S. Cl.
CPC ........... *F16M 11/04* (2013.01); *H05K 5/0017* (2013.01); *H05K 5/0234* (2013.01);
(Continued)

(58) Field of Classification Search
CPC ......... G02F 1/133308; G02F 2201/503; G02F 2201/46; G02F 1/133608;
(Continued)

(56) References Cited

U.S. PATENT DOCUMENTS 3,746,067 A * 7/1973 Gulistan .................. B21H 3/02
29/512
2008/0297998 A1* 12/2008 Choi ........................ H04N 5/64
361/679.02
(Continued)

FOREIGN PATENT DOCUMENTS

CN 201467328 U 5/2010
EP 1813852 A1 8/2007
(Continued)

OTHER PUBLICATIONS

International Search Report and Written Opinion both dated Oct. 29, 2015; PCT/CN2015/081419.
(Continued)

*Primary Examiner* — James Wu
(74) *Attorney, Agent, or Firm* — Ladas & Parry LLP

(57) ABSTRACT

A fitting structure and a display device are provided. The fitting structure comprises a first device (22), a second device (33) and a position-limiting device (11) configured to fixedly connect the first device (22) and the second device (23), wherein the position-limiting device (11) comprises a pre-fitting stepped portion (113) which is provided in the first device (22), and a threaded portion (111) and a relief groove portion (112) which are provided in the second device (33), and the relief groove portion (112) is arranged
(Continued)

between the pre-fitting stepped portion (113) and the threaded portion (111); a height of the relief groove portion (112) is set so that the pre-fitting stepped portion (113) is in contact with a fixing face which is an end face of the second device (33) which is fixedly connected by the position-limiting device (11). The fitting structure can solve a problem of a gap between an end face of the base and an end face of the rear casing being increased when the base is subjected to a force.

15 Claims, 5 Drawing Sheets

(51) Int. Cl.
*F16M 11/04* (2006.01)
*H05K 5/02* (2006.01)
*G02F 1/1333* (2006.01)

(52) U.S. Cl.
CPC .............. *G02F 1/133308* (2013.01); *G02F 2001/133314* (2013.01); *G06F 1/1601* (2013.01)

(58) Field of Classification Search
CPC ...... G02F 2001/133322; H05K 5/0017; H05K 2201/10409; H05K 5/0234; G06F 1/1601; F16M 11/04; F16M 2200/08
See application file for complete search history.

(56) References Cited

U.S. PATENT DOCUMENTS

| | | |
|---|---|---|
| 2009/0095870 A1 | 4/2009 | Chang |
| 2011/0031364 A1 | 2/2011 | Kneshtel, Jr. et al. |
| 2013/0086855 A1* | 4/2013 | Grandgirard ..... B29C 45/14065 52/204.591 |
| 2013/0256492 A1 | 10/2013 | Liu et al. |
| 2014/0166834 A1 | 6/2014 | Kuroyanagi et al. |

FOREIGN PATENT DOCUMENTS

| | | |
|---|---|---|
| JP | 2000-337590 A | 12/2000 |
| JP | 3190247 U | 4/2014 |
| KR | 1020050051150 A | 6/2005 |
| WO | 2012/089704 A1 | 7/2012 |

OTHER PUBLICATIONS

KIPO Office Action dated Nov. 29, 2017; Appln. No. 10-2016-7031389.

The Extended European Search Report dated Aug. 9, 2018; Appln. No. 15858089.4.

* cited by examiner

FITTING STRUCTURE AND DISPLAY DEVICE

TECHNICAL FIELD

Embodiments of the present invention relate to a fitting structure and a display device.

BACKGROUND

At present, a display screen is placed on a desk or on the ground by a base disposed on the desk or on the ground. The base has a function of supporting and securing the display screen.

Typically, the base is mounted in a rear casing of the display screen. For example, as illustrated in FIG. 1, there is a pre-positioning structure on an end face of the base where the base and the rear casing are contacted, by which the base can be fitted into the rear casing. The base is locked to a base securing bracket by means of a position-limiting device and thus is secured.

However, in the above configuration, an actual mounting height of the position-limiting device is higher than an ideal mounting height, as a result of which the position-limiting device cannot have the base completely secured. When the base is subjected to a force applied in a direction parallel to the end face of the base, a gap between the end face of the base and an end face of the rear casing is inclined to increase, and thus the base is deformed and warped.

SUMMARY

According to a first aspect of the present invention, a fitting structure is provided, which comprises a first device, a second device, and a position-limiting device configured to fixedly connect the first device and the second device, wherein the position-limiting device comprises a pre-fitting stepped portion which is provided in the first device and a threaded portion and a relief groove portion which are provided in the second device, and the relief groove portion is arranged between the pre-fitting stepped portion and the threaded portion; a height of the relief groove portion is set so that the pre-fitting stepped portion is in contact with a fixing face, and the fixing face is an end face of the second device which is fixedly connected by the position-limiting device.

According to a second aspect of the present invention, a display device is provided, which comprises the fitting structure described above.

BRIEF DESCRIPTION OF THE DRAWINGS

In order to more clearly illustrate the technical solutions of the embodiments of the invention, the drawings of the embodiments will be briefly described in the following; it is obvious that the drawings described below are only related to some embodiments of the invention and thus are not limitative of the invention.

Figure 1:
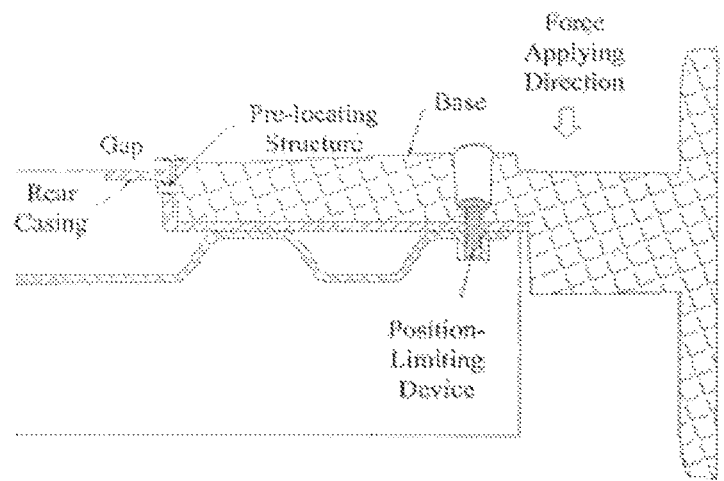
FIG. 1 is a structural view illustrating a fitting structure provided by conventional arts.

| Description of Reference Numerals: | | |
|---|---|---|
| 11-position-limiting device | 111-threaded portion; | 112-relief groove portion; |
| 113-pre-fitting stepped portion; | 114-position-limiting stepped portion; | 12-groove; |
| 121-spherical portion; | 122-cylindrical portion; | 22-first device; |
| 33-second device; | 44-third device; | 221-end face of the first device; |
| 441-end face of the third device; | 66-positioning device; | 10-fitting structure; |
| 1-display device; | 20-display screen; | 30-display circuit. |
| 23, fixing face; | 40, base. | |

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment One

Figure 2:
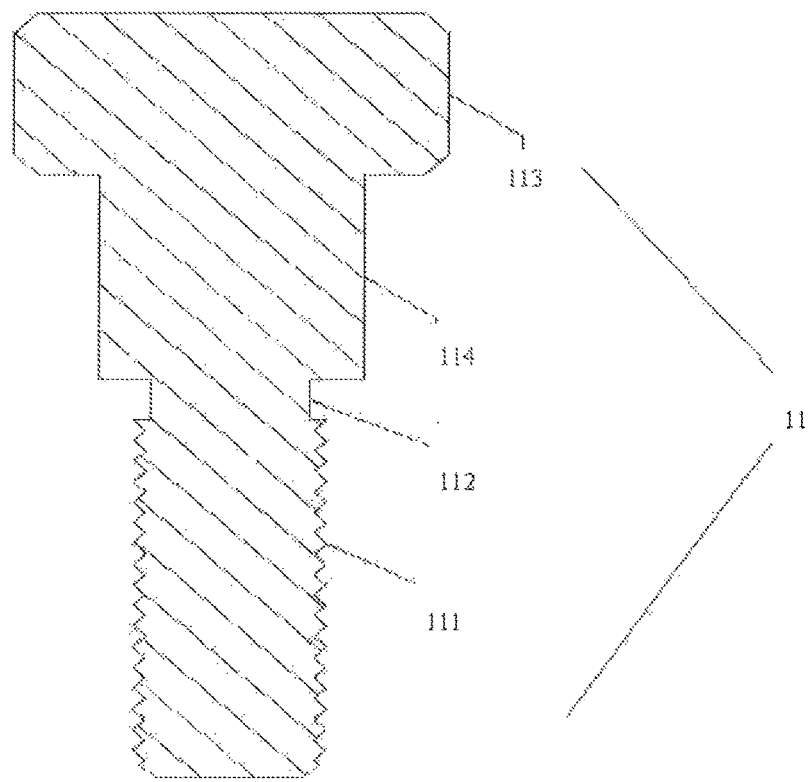
FIG. 2 is a structural view illustrating a position-limiting device according to an embodiment of the present invention.
Figure 3:
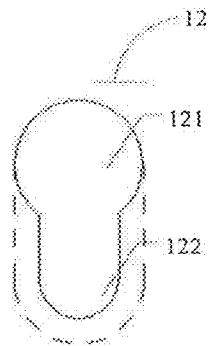
FIG. 3 is a structural view illustrating a groove according to an embodiment of the present invention which is engaged with the position-limiting device.
Figure 4:
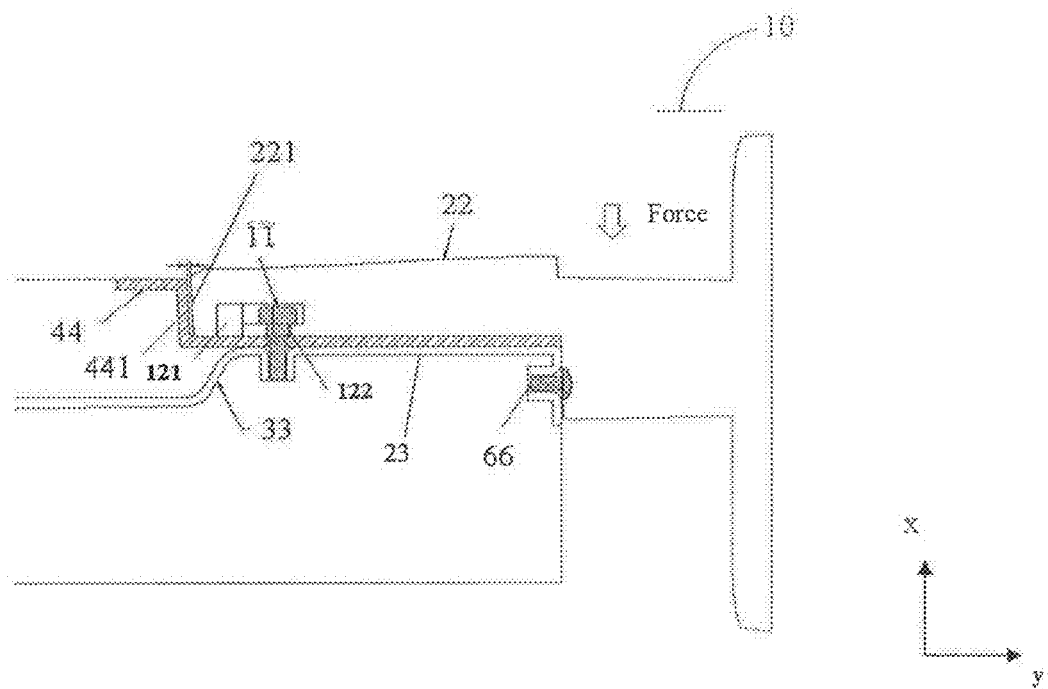
FIG. 4 is a structural view illustrating a fitting structure according to an embodiment of the present invention which comprises the position-limiting device of FIG. 2.

Referring to FIG. 2 to FIG. 4, the Embodiment One of the present invention provides a fitting structure 10. The fitting structure 10 comprises a position-limiting device 11, a first device 22 and a second device 33. The position-limiting device 11 is configured to fixedly connect the first device 22 and the second device 33. The first device 22 is a base, for example. The second device 33 is a base securing bracket, for example. The position-limiting device 11 is a screw, for example.

As illustrated in FIG. 2, the position-limiting device 11 comprises a threaded portion 111, a relief groove portion 112 and a pre-fitting stepped portion 113. The relief groove portion 112 is arranged between the pre-fitting stepped portion 113 and the threaded portion 111.

Figure 8:
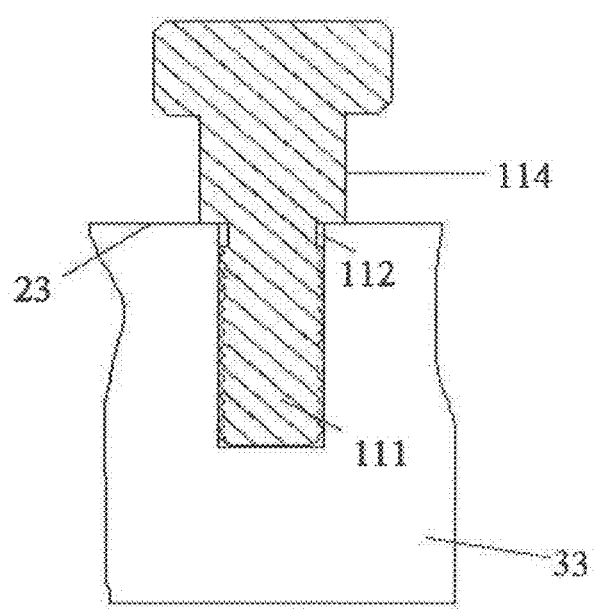
FIG. 8 is a structural view illustrating that a position-limiting stepped portion is in contact with a fixing face through the bottom surface of the position-limiting stepped portion.

The relief groove portion 112 has a height which can be set within a preset range, so that the threaded portion 111 and the relief groove portion 112 of the position-limiting device 11 are completely fixed in the second device 33, and the pre-fitting stepped portion 113 is completely fixed in the first device 22 and the position-limiting stepped portion 114 (for example, through its lower surface) is in contact with a fixing face 23, as illustrated in FIG. 8, wherein the fixing face 23 is a face of the second device 33 which is fixedly connected by the position-limiting device 11.

The threaded portion 111 has threads, thereby facilitating to screw the position-limiting device 11 into the second device 33.

In conventional technologies, as it is not easy for the threaded portion to be completely locked, its mounting height is higher than a prescribed one, which causes an issue that the position-limiting device is prone to move. Therefore, the embodiments of the present invention can make it easy for the threaded portion to be completely locked, and ensure that the mounting height of the position-limiting device is within a predetermined range of height and that the position-limiting device is not allowed to move easily.

In at least one embodiment of the present invention, the height of the relief groove portion is set to be equal to or less than 0.05 mm.

Compared with a height of 0.2 to 0.5 mm in conventional technologies, the above high precision enables the threaded portion to be completely locked. That is to say, the high precision in the embodiments of the present invention can make the height of the position-limiting device 11 be consistent with the predetermined height and thus the position-limiting device is not allowed to easily move.

In at least one embodiment of the present invention, the relief groove portion 112 has a diameter which is equal to or less than the minimum inner diameter of the threaded portion 111.

In at least one embodiment of the present invention, the position-limiting device 11 further comprises a position-limiting stepped portion 114 which is arranged between the pre-fitting stepped portion 113 and the relief groove portion 112. For example, the position-limiting stepped portion 114 has a diameter which is greater than the maximum outer diameter of the threaded portion 111.

When the first device 22 and the second device 33 are connected by the position-limiting device 11, the position-limiting stepped portion 114 is positioned in the first device and is in contact with the fixing face 23, so that the relief groove portion 112 of the position-limiting device 11 is completely dropped into the second device 33.

In at least one embodiment of the present invention, the position-limiting device 11 having the above structure can be mounted into a groove 12 as illustrated in FIG. 3, so that it is hard for the position-limiting device 11 to be loosen. The groove 12 comprises a spherical portion 121 and a cylindrical portion 122. The spherical portion 121 has a diameter which is slightly greater than the diameter of the pre-fitting stepped portion 113 of the position-limiting device 11, so that the position-limiting device 11 can be freely moved in or out of the spherical portion 121. Moreover, the cylindrical portion 122 has a diameter which is slightly less than the diameter of the position-limiting stepped portion 114 of the position-limiting device 11, so that the position-limiting stepped portion 114 of the position-limiting device 11 can be fitted into the cylindrical portion 122. Specifically, when being in use, an upper end portion of the position-limiting device 11 is firstly moved into the spherical portion 121 of the groove 12 along an x-direction, and then the position-limiting device 11 is moved toward the cylindrical portion 122 of the groove 12 along a y-direction perpendicular to the x-direction, so that the position-limiting stepped portion 114 is fitted in the cylindrical portion 122.

The above is only an exemplified illustration of the shape of the groove matched with the position-limiting structure and the corresponding fitting process. The present invention is not limited to the groove structure and manner described in the embodiment, but can be implemented in various structures and manners of the groove matched with the position-limiting structure of the present invention.

When the threaded portion 111 and the relief groove portion 112 are fixed in the second device 33, the pre-fitting stepped portion 113 of the position-limiting device 11 is embedded in the first device. Therefore, when the position-limiting device 11 is viewed from the outside of the first device 22, the position-limiting device 11 is not visible.

As illustrated in FIG. 4, the position-limiting device 11 can be configured to connect the first device 22 and the second device 33, wherein a groove which is similar to that of FIG. 3 can be provided in the first device 22, so that the position-limiting device 11 can be fitted into the groove of the first device 22. The pre-fitting stepped portion 113 of the position-limiting device 11 can be embedded into the first device 22, so that the position-limiting device 11 is not visible when the position-limiting device 11 is viewed from the outside of the first device 22. By means of such a structure in which the position-limiting device 11 is embedded in the first device 22, the first device 22 has a good appearance and is integrated.

Figure 6:
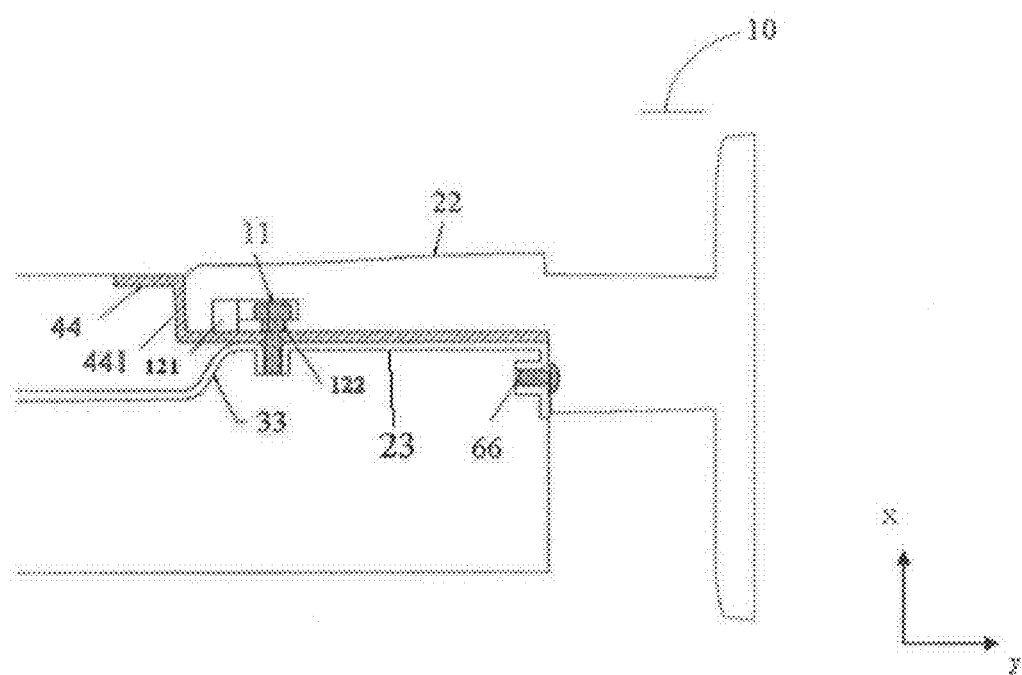
FIG. 6 is a structural view illustrating a fitting structure according to an embodiment of the present invention which comprises the position-limiting device of FIG. 2.

In at least one embodiment of the present invention, the fitting structure 10 further comprises a third device 44, which can be a casing for example, as illustrated in FIG. 4. The second device 33 and the third device 44 are connected. After the position-limiting device 11 passes through the third device 44 and fixedly connects the first device 22 and second device 33, a contacting face is formed between the first device 22 and the third device 44 without a gap, as illustrated in FIG. 6. For example, an end face 221 of the first device 22 is contacted with an end face 441 of the third device 44 smoothly.

Unlike conventional technologies in which a pre-positioning structure is provided on the end face 221 of the first device (as illustrated in FIG. 1), there is a smooth contact between the end face 221 of the first device and the end face 441 of the third device in the embodiment of the present invention. It can be appreciated that no manual alignment is required before the position-limiting device 11 is fixed to the first device and thus it is easier to mount the first device onto the third device.

In the embodiment of the present invention, in view of that the first device 22 is composed of a broad base and a post having a certain height and that the center of gravity of the first device 22 is closer to the base, the position-limiting device 11 is arranged to be closer to the contacting face between the first device 22 and the third device 44, for example to the end face 221 of the first device 22. In case the first device is subjected to an external force in a direction illustrated in FIG. 4, the gap between the end face 221 of the first device and the end face 441 of the third device is hard to be increased.

In at least one embodiment of the present invention, an inserting direction of the position-limiting device 11 into the first device 22 is parallel to the contacting face between the first device 22 and the third device 44.

Referring to FIG. 4, the inserting direction of position-limiting device 11 into the first device 22 is parallel to the end face 221 of the first device, thereby avoiding the issue of deformation and warp or gap increasing when the first device is subjected to an external force in a direction illustrated in FIG. 4, and thereby obtaining a structure having a good appearance.

It should be noted that FIG. 4 is only a sectional view of the fitting structure. Only one position-limiting device is shown in this sectional view. In fact, there can be two position-limiting devices provided in the whole fitting structure. Compared with four to six position-limiting devices required in the conventional technologies, less position-limiting devices is required and the cost is decreased accordingly.

In at least one embodiment of the present invention, the fitting structure further comprises a positioning device 66 configured to connect the first device 22 and the second device 33. A slot corresponding to the positioning device 66 is provided at the bottom of the second device 33, so that the first device 22 is fixed onto the second device 33 by inserting into the slot corresponding to the positioning device 66. The positioning device 66 is a screw for example.

As illustrated in FIG. 4, an inserting direction of the positioning device 66 in the second device 33 is perpendicular to the inserting direction of the position-limiting device 11 in the second device 33. By providing the positioning device 66, the base can be more firmly secured to the base securing bracket which is connected with the casing. Moreover, the positioning structure is provided at the bottom of the base, and thus is not easily visible, as a result of which the exterior appears good.

Embodiment Two

Figure 5:
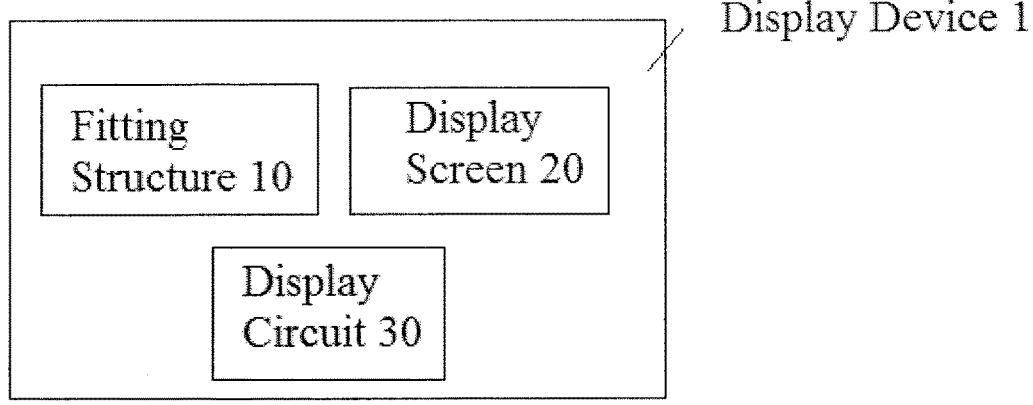
FIG. 5 is a structural block diagram of a display device according to an embodiment of the present invention which comprises the fitting structure.

The Embodiment Two of the present invention provides a display device 1. As illustrated in FIG. 5, the display device 1 comprises a display screen 20, a display circuit 30 and the fitting structure 10 as described in any one of the above embodiments. The display device further comprises a base 40 to which the display screen 20 is secured by the fitting structure.

Figure 7:
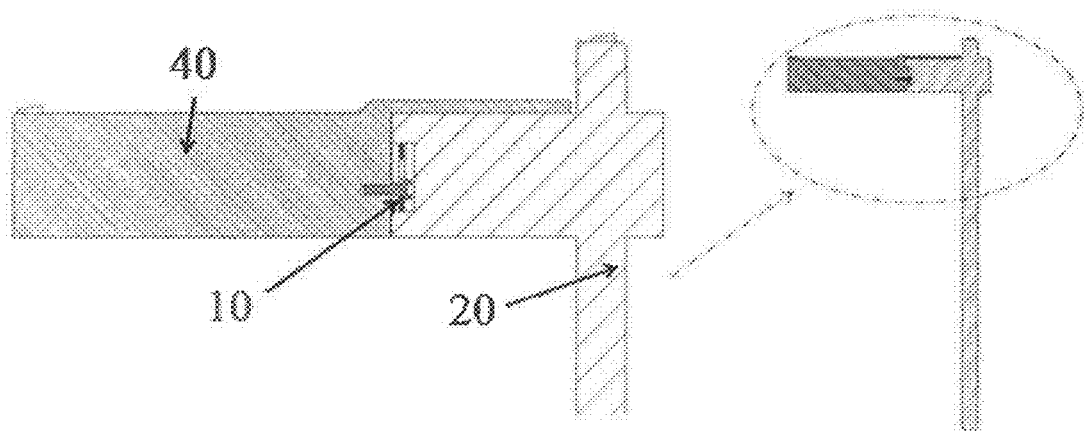
FIG. 7 is a structural view illustrating a display screen is secured to a base by the fitting structure according to one embodiment of the present disclosure.

As illustrated in FIG. 7, the display screen 20 is secured to the base through the fitting structure. The specific configuration of the fitting structure 10 is illustrated in FIG. 2 to FIG. 4 and is not described in detail anymore.

The foregoing are merely exemplary embodiments of the invention, but are not used to limit the protection scope of the invention. The protection scope of the invention shall be defined by the attached claims.

The present application claims priority of Chinese Patent Application No. 201520035871.7 filed on Jan. 19, 2015, the disclosure of which is hereby entirely incorporated by reference.

The invention claimed is:

1. A fitting structure, comprising a first device, a second device, and a position-limiting device configured to fixedly connect the first device and the second device,
wherein the position-limiting device comprises a pre-fitting stepped portion which is provided in the first device and a threaded portion and a relief groove portion which are provided in the second device, and the relief groove portion is arranged between the pre-fitting stepped portion and the threaded portion;
the position-limiting device further comprises a position-limiting stepped portion which is arranged between the pre-fitting stepped portion and the relief groove portion and is located in the first device; and
a height of the relief groove portion is set so that the position-limiting stepped portion is in contact with a fixing face which is a face of the second device which is fixedly connected by the position-limiting device; and
wherein the fitting structure further comprises a positioning device configured to connect the first device and the second device, a slot corresponding to the positioning device is disposed at the bottom of the second device, so that the first device is fixed onto the second device by inserting into the slot of the positioning device, and an inserting direction of the positioning device in the second device is perpendicular to an inserting direction of the position-limiting device in the second device.

2. The fitting structure according to claim 1, wherein the height of the relief groove portion is equal to or less than 0.05 mm.

3. A display device, comprising the fitting structure according to claim 2.

4. The display device according to claim 3, further comprising a display screen and a base, wherein the display screen is secured to the base by the fitting structure.

5. The fitting structure according to claim 1, wherein the threaded portion and the relief groove portion are completely fixed in the second device, while the pre-fitting stepped portion is completely fixed in the first device.

6. The fitting structure according to claim 1, wherein the position-limiting stepped portion has a diameter which is greater than a maximum outer diameter of the threaded portion.

7. The fitting structure according to claim 1, wherein the relief groove portion has a diameter which is equal to or less than a minimum inner diameter of the threaded portion.

8. The fitting structure according to claim 1, further comprising a third device through which the position-limiting device fixedly connects the first device and second device, so that a contacting face is formed between the first device and the third device without a gap.

9. The fitting structure according to claim 8, wherein the position-limiting device is arranged to be closer to the contacting face.

10. The fitting structure according to claim 8, wherein an inserting direction of the position-limiting device into the first device is parallel to the contacting face.

11. The fitting structure according to claim 8, wherein the third device is a casing.

12. The fitting structure according to claim 1, wherein the fitting structure comprises two position-limiting devices.

13. The fitting structure according to claim 1, wherein the first device is a base, and the second device is a base securing bracket.

14. A display device, comprising the fitting structure according to claim 1.

15. The display device according to claim 14, further comprising a display screen and a base, wherein the display screen is secured to the base by the fitting structure.

* * * * *